United States Patent [19]

Bovermann

[11] Patent Number: 4,754,944
[45] Date of Patent: Jul. 5, 1988

[54] APPARATUS FOR ATTACHMENT OF MULTIPLE STRUCTURAL SUPPORT BRACKETS TO SWITCH BOXES

[75] Inventor: Klaus-Dieter Bovermann, Niederdieten, Fed. Rep. of Germany

[73] Assignee: Rittal-Werk Rudolf Loh GmbH & Co. KG, Fed. Rep. of Germany

[21] Appl. No.: 883,619

[22] Filed: Jul. 9, 1986

[30] Foreign Application Priority Data

Jul. 9, 1985 [DE] Fed. Rep. of Germany ....... 3524400

[51] Int. Cl.⁴ .............................................. H02G 3/08
[52] U.S. Cl. .................................. 248/295.1; 220/3.9; 248/DIG. 6
[58] Field of Search ............... 248/220.2, 223.2, 223.4, 248/224.1, 224.2, 225.31, 231.5, 231.7, DIG. 6, 295.1, 298; 220/3.9, 3.7, 3.6; 403/331, 341, 379

[56] References Cited

U.S. PATENT DOCUMENTS

| | | | |
|---|---|---|---|
| 1,555,659 | 9/1925 | Gough | 248/225.31 |
| 2,173,159 | 9/1939 | Ewan | 248/224.1 |
| 2,473,051 | 6/1949 | Carlson | 248/27.1 |
| 3,122,252 | 2/1964 | Jones | 248/224.1 |
| 3,265,935 | 8/1966 | Rosa | |
| 4,209,098 | 6/1980 | Adams | 248/224.2 |
| 4,645,089 | 2/1987 | Horsley | 220/3.6 |

FOREIGN PATENT DOCUMENTS

| | | | |
|---|---|---|---|
| 70048 | 2/1945 | Denmark | 248/224.2 |
| 1084340 | 6/1960 | Fed. Rep. of Germany | |
| 7438460 | 3/1975 | Fed. Rep. of Germany | |
| 2530417 | 10/1977 | Fed. Rep. of Germany | |
| 2515345 | 1/1985 | Fed. Rep. of Germany | |

Primary Examiner—J. Franklin Foss
Assistant Examiner—Robert A. Olson
Attorney, Agent, or Firm—Thomas W. Speckman; Ann W. Speckman

[57] ABSTRACT

A device for fastening support brackets to vertical frame components at the forward side of switch boxes whereby connecting brackets provided with threaded connectors are connectable to the frame components, so that the front plates of the support brackets can be screwed to the connecting bracket. In order for the vertical interval of the support bracket on the switch box to be continuously variable and the support brackets to be removable even with telescoping extensions, the invention provides that, on both frame pieces forming the front side of the switch box, connecting brackets are mounted, which are aligned facing one another with a vertical connecting bar directed parallel to the front side, and that on this connecting bar, sliding elements may be mounted to which support brackets may be attached in the desired position with a threaded connector.

20 Claims, 1 Drawing Sheet

U.S. Patent        Jul. 5, 1988        4,754,944
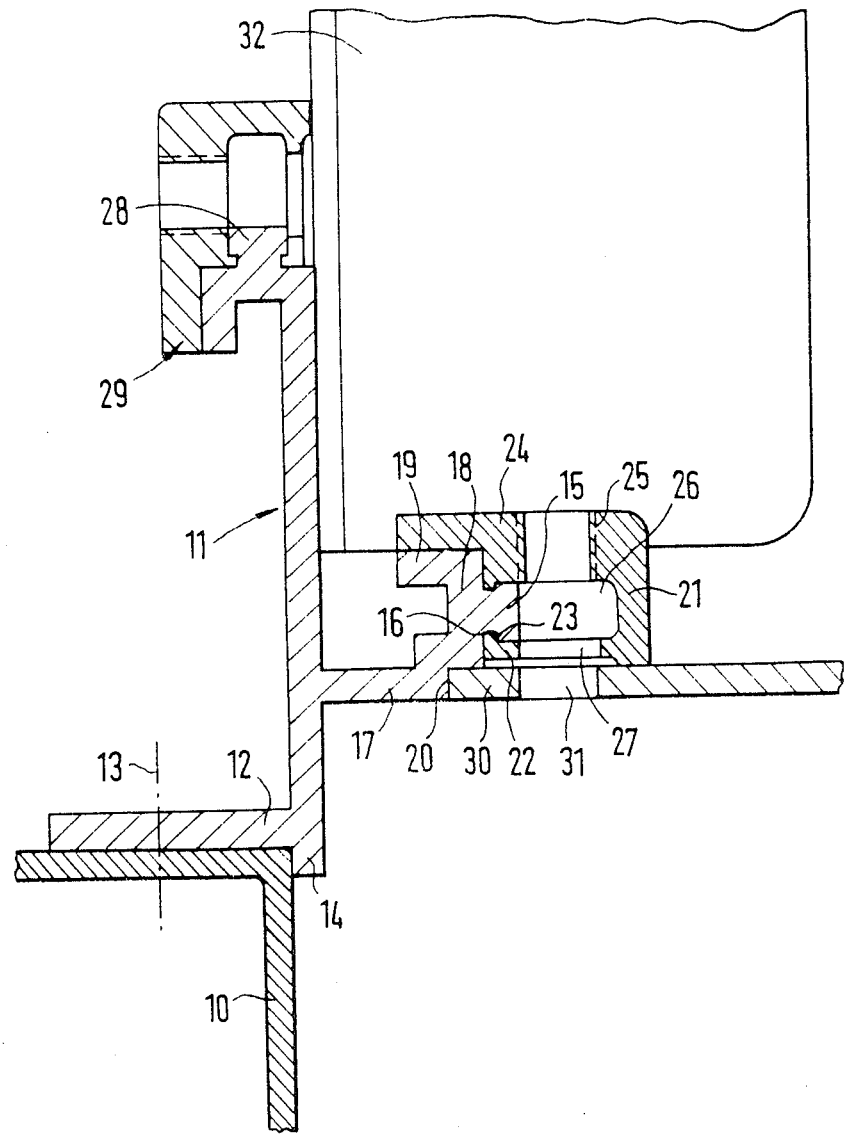

APPARATUS FOR ATTACHMENT OF MULTIPLE STRUCTURAL SUPPORT BRACKETS TO SWITCH BOXES

BACKGROUND OF THE INVENTION

1. Field of the Invention

This invention relates to a device for attachment of multiple structural support brackets to the vertical frame components at the front side of a switch box, in which equipment holders provided with threaded connectors can be attached to the frame components and the front plates of the support brackets can be screwed to the threaded connectors.

2. Description of the Prior Art

In known devices of this type, equipment holders are formed as angular pieces which have, in one piece, a threaded connector for screwing to the front plate of the support bracket, and have, in the other piece, a bore for an attachment screw, by means of which the angular piece is attached to the frame component. The frame component has an opening T-slot into which strips having threaded bores positioned at intervals may be inserted.

These prior art devices have the advantage that, between the angular pieces, sufficient space exists to connect the support brackets to the switch box by means of a telescoping extension, so that, after loosening the attaching screws which connect the front plate to the angular pieces, it can be removed from the switch box. Since the strip pieces having threaded bores determine the positioning locations, the vertical intervals of the support brackets cannot be varied in the switch box, and are therefore firmly specified.

A device is also known in which specially formed nuts can be inserted into the open T-slot formed in the frame component. These special nuts can be inserted vertically into the T-slot, and may be retained in the T-slot by means of a spring, to facilitate screwing in of an attaching screw.

With this known device, the vertical interval of the support brackets on the switch box can be continuously varied. Between the attachment points to the frame pieces, however, there is no space to pass out a telescoping extension. The support brackets thus cannot be attached on the switch box by means of a telescoping extension.

SUMMARY OF THE INVENTION

It is an object of the present invention to provide a device of the type described above, in which the vertical interval of the support brackets on the switch box can be continuously adjusted, and which permits attachment of the support brackets on the switch box even by means of telescoping extensions.

This object is achieved in accordance with the present invention in that on both frame components of the front side of the switch box, connecting brackets are attached opposite one another, with a vertical connecting bar which is oriented parallel to the front side, and that, sliding elements provided with a threaded receptacle may be fastened and fixed in any desired position on the connecting bars.

The sliding elements may be attached at desired places on the connecting bars of the connecting brackets, so that the vertical interval between support brackets may be adjusted. Between the sliding elements there is still enough space, however, to extend a telescoping extension from the switch box. The telescoping extension is situated between both the sliding elements which are used on each side to attach an assembly support bracket.

To attach the connecting bracket to the vertical frame components of the switch box, one embodiment provides that the connecting brackets are provided along one longitudinal edge with an angular flange which can be attached to the rear side of the vertical frame components of the switch box. The connecting bar is thus provided on the side of the connecting bracket which is away from the flange.

Fitting of the connecting bracket to the frame component is facilitated in one embodiment wherein the connecting bracket is provided with a support bar which extends beyond the flange.

In accordance with one embodiment, it is provided that the connecting bar is formed on a U-shaped bar, one side leg of which is connected to the connecting bracket; that the U-shaped bar is oriented with its open side facing the connecting bracket; and that the connecting bar is provided on the external side of the middle piece of this U-shaped bar. In this way, the connecting bar is provided at a sufficient distance from the frame component.

If, in accordance with another embodiment, the connecting bar is provided on at least one lateral wall, which is oriented parallel to the front of the switch box, with a receiving groove for mounting projections of the sliding elements, then the support of the sliding elements on the connecting bar is substantially improved.

In order for the sliding elements to be attached at desired places on the connecting bar and perpendicular to its longitudinal axis, one embodiment provides that the sliding elements comprise two generally flat lateral segments, one lateral segment provided with a threaded receptacle and the other lateral segment provided with a through bore for attachment screws; that, by means of the attachment screw, the front plate of the support bracket may be connected with both lateral segments of the sliding element which abut the connecting bar; and that, by this means, both lateral segments of the sliding element can be simultaneously mounted on the connecting bar, so that the attachment of one lateral segment of the sliding element firmly retains the sliding element on the connecting bar in a non-removable manner.

This assembly can be simplified in accordance with another embodiment wherein the sliding elements are generally U-shaped and are provided with a transverse slot perpendicular to the threaded receptacle which is provided in one side piece of the sliding element, and the other side piece is provided with an aligned through bore for the attaching screw. In this way, one part of the sliding element may be resilient and provided on its inner side with a mounting projection engageable with a receiving groove of the connecting bar, in order to provide a locking connection which secures the inserted sliding element on the connecting bar and facilitates the insertion of the attaching screw.

If, in accordance with another embodiment, the longitudinal edge of the connecting bracket extending perpendicular to the forward side of the switch box from the flange forms an additional connecting bar, then an additional connecting plane is created by the connecting bracket which can be used, for example, for attachment of the telescoping extension. So that this attachment does not impair the extension of the support bracket, a further embodiment provides that the additional connecting bar is provided on a U-shaped bar and that inserted sliding elements may be secured and seal snugly with the inner other side of the connecting bar.

The front facing connection of the support bracket with the connecting bracket is constructed so that the connecting bar provided on the U-shaped bar is displaced in the direction of the switch box, and the front plate of the support bracket snugly abuts the adjacent portion of the U-shaped bar which is provided with a corresponding recess for the front plate.

BRIEF DESCRIPTION OF THE DRAWING

The invention is illustrated in greater detail by means of an embodiment shown in cross section in the FIGURE.

DESCRIPTION OF PREFERRED EMBODIMENTS

The FIGURE shows connecting bracket (11) provided with flange (12) on its longitudinal edge attached to vertical frame component (10). Frame component (10) has a series of bores on its rear side so that flange (12) may be screwed in several places to frame piece (10), as connection (13) indicates. The longitudinal edge of connecting bracket (11) forming support bar (14) extends beyond flange (12) which facilitates its attachment to frame component (10).

Extending from the side of connecting bracket (11) which is opposite flange (12), is contoured connecting bar (15), which is aligned parallel to the front side of the switch box. On the opposite vertical frame component of the front side of the switch box, a corresponding connecting bracket (11) may be attached, which, with its connecting bar (15), lies in the same plane, and opposite the other connecting bracket (11).

Connecting bar (15) is provided on the external side of middle piece (18) of the U-shaped bar having side legs (17, 19). Side leg (17) is provided on the outside with recess (20) for front plate (30) of support bracket (32), and is formed in a single piece with connecting bracket (11). The front portion of connecting bar (15), which extends parallel to the front side of the switch box, forms receiving groove (16) for retaining mounting projection (23) extending from sliding element (21). Sliding element (21) is divided by transverse slot (26) into lateral segments (22, 24), so that through bore (27) for the attaching screw is positioned in lateral segment (22). The attaching screw is inserted through bore (31) in front plate (30) and bore (27) in lateral segment (22) of sliding element (21), and is then screwed into the threaded receptacle (25) in lateral segment (24). Since lateral segment (22) is resilient, sliding element (21) can be locked in position perpendicular to connecting bar (15), so that lateral segment (22) extends far enough for mounting projection (23) to catch in receiving groove (16). The locking connection is such that sliding element (21) is retained on connecting bar (15), and does not slide downward. If an attaching screw is screwed into threaded receptacle (25), front plate (30) resting in recess (20) formed in side piece (17) retains lateral segment (22) on connecting bar (15) and lateral segment (24) is drawn toward connecting bar (15), and braced on the same, so that sliding element (21) is supported axially and non-displaceably on connecting bar (15). Since mounting projection (23) is positively retained in receiving groove (16), sliding element (21) also is not removable from connecting bar (15) oriented parallel to front plate (30).

The same effect can also be attained with a two-piece sliding element (21), divided in the area of transverse slot (26) into two generally flat parts, which are provided on the lateral walls of connecting bar (15), and are retained on the same by means of the attaching screw. The part which forms lateral segment (22) has mounting projection (23) on its inner side.

Connecting bar (15) formed at the base of the U-shaped part comprising side legs (17, 19), as well as middle piece (18), extends towards the interior of the switch box relative to frame component (10), and in the direction of the opposite frame component. If an assembly support bracket is provided with sliding elements (21), in a lower and upper area of its front plate (30), enough space remains between both these sliding elements (21), that is, between the connecting bars (15) which are aligned with one another, to attach a telescopic extension to connecting bracket (11) in such a manner that it can be removed between both sliding elements (21). Furthermore, the rear longitudinal edge of the connecting bracket (11) can itself be contoured as connecting bar (28), which is formed on a U-shaped extension in one piece with the connecting bracket (11). Sliding elements (29) may be inserted and secured in the same manner to connecting bar (28). Connecting bar (28) is formed identically to connecting bar (15), so that sliding elements (29) can also be formed identically to sliding elements (21). Connecting bar (28) is displaced sufficiently far from the internal side of connecting bracket (11) and connecting bar (15), that sliding element (29) snugly seals with such internal side due to its resilience.

The U-shaped portion formed by side legs (17, 19) and middle piece (18), determines, through its position with respect to flange (12), the position of front plate (30) of the assembly support bracket on the switch box. Recess (20) formed in side piece (17) is dimensioned so that front plate (30) seals snugly with side piece (17). Instead of front plate (30), the assembly support bracket may be provided with lateral attachment flanges, which are attached like front plate (30) of the illustrated embodiment. In the embodiment described, the support bracket (32) rests on a sliding rail which is attached by means of sliding piece (29) to connecting bar (28) of connecting bracket (11).

I claim:

1. A switch box and apparatus for attachment of multiple structural support brackets to vertical frame components of a switch box, whereby support brackets provided with threaded connectors are connectable to said frame components and front plates of said support brackets are fastenable to said threaded connectors, comprising at least two connecting brackets (11) attached to said frame components (10) of said switch box, said connecting brackets aligned opposite one another, a contoured connecting bar (15) provided with a receiving groove (16), said contoured connecting bar (15) extending between said connecting brackets and projecting from said connecting brackets in a plane parallel to a front side of said switch box, and at least one sliding element (21) provided with a threaded receptacle and a mounting projection (23) slidingly engageable on said receiving groove of said connecting bar to which said support brackets provided with threaded connectors are attachable by an attachment screw.

2. An apparatus in accordance with claim 1, wherein said connecting brackets (11) have an angular flange (12) extending from one longitudinal edge, said angular flange (12) attached to a rear side of said vertical frame components (10) of said switch box.

3. An apparatus in accordance with claim 2, wherein said connecting bar (15) projects from said connecting bracket (11) in a direction opposite from said angular flange (12).

4. An apparatus in accordance with claim 2, wherein said one longitudinal edge of said connecting bracket (11) provided with said flange (12), additionally forms an additional connecting bar (28) aligned perpendicular to said front side of said switch box.

5. An apparatus in accordance with claim 2, wherein a support bar (14) is formed by an extension of said connecting bracket (11) beyond said angular flange (12).

6. An apparatus in accordance with claim 3, wherein a support bar (14) is formed by an extension of said connecting bracket (11) beyond said angular flange (12).

7. An apparatus in accordance with claim 1, wherein said at least one sliding element (21) comprises a U-shaped piece with two lateral segments and a transverse slot (26), one said lateral segment (24) provided with said threaded receptacle (25), and the other said lateral segment (22) provided with a bore (27) for receiving said attachment screw, and said transverse slot (26) extends perpendicular to said threaded receptacle (25) and said bore (27).

8. An apparatus in accordance with claim 1, wherein said at least one sliding element (21) is resilient, and said mounting projection (23) engageable with said receiving groove (16) of said contoured connecting bar (15) is provided on an internal side of said sliding element.

9. An apparatus in accordance with claim 1, wherein said receiving groove (16) is provided in at least one lateral wall of said connecting bar (15), and said receiving groove (16) is aligned parallel to said front side of said switch box.

10. Apparatus for attachment of multiple structural support brackets to vertical frame components of a switch box, whereby support brackets provided with threaded connectors are connectable to said frame components and front plates of said support brackets are fastenable to said threaded connectors, comprising at least two connecting brackets (11) having an angular flange (12) extending from one longitudinal edge, said connecting brackets (11) attachable to said frame components (10) of said switch box at said angular flange, and a support bar formed as an extension of said connecting bracket beyond said angular flange (12), said connecting brackets aligned opposite one another; a generally U-shaped bar comprising a middle piece (18) and two side legs (17, 19) connected to said connecting brackets by one said side leg and extending from said connecting brackets in a direction opposite from said angular flange (12), a connecting bar (15) mounted on said generally U-shaped bar, said connecting bar (15) extending between said connecting brackets and directed parallel to a front side of said switch box; and at least one sliding element (21) provided with a threaded receptacle slidingly engageable on said connecting bar, to which said support brackets provided with threaded connectors are attachable by an attachment screw.

11. An apparatus in accordance with claim 1, wherein said U-shaped bar is aligned with its opening facing said connecting bracket (11), said connecting bar (15) is provided on an external side of said middle piece facing away from said connecting bracket.

12. An apparatus in accordance with claim 11, wherein said receiving groove (16) is provided between said generally U-shaped bar and said contoured connecting bar (15), said receiving groove (16) is aligned parallel to said front side of said switch box, and said mounting projection (23) is resilient.

13. An apparatus in accordance with claim 12, wherein said at least one sliding element (21) comprises two generally flat parts, one said part provided with said threaded receptacle (25), and the other said part provided with a bore (27) corresponding to said attachment screw, and a front plate of said assembly support is connectable to both said parts of said sliding element (21) slidingly engaged on said connecting bar (15) by said attachment screw, and both said parts of said sliding element (21) are secured simultaneously to said connecting bar (15) by said attachment screw, with said mounting projection (23) of one said part of said sliding element (21) secured in a non-removable manner to said connecting bar (15).

14. An apparatus in accordance with claim 7, wherein said at least one sliding element (21) comprises a U-shaped piece with two lateral segments and a transverse slot (26), one said lateral segment (24) provided with said threaded receptacle (25), and the other said lateral segment (22) provided with a bore (27) for receiving said attachment screw, and said transverse slot (26) extends perpendicular to said threaded receptacle (25) and said bore (27).

15. An apparatus in accordance with claim 14, wherein one said lateral segment comprising said sliding element (21) is resilient, and said mounting projection (23) engageable with said reception slot (16) of said connecting bar (15) is provided on an internal side of one said lateral segment.

16. An apparatus in accordance with claim 15, wherein said one longitudinal edge of said connecting bracket (11) provided with said flange (12), additionally forms an additional connecting bar (28) aligned perpendicular to said front side of said switch box.

17. An apparatus in accordance with claim 16, wherein said additional connecting bar (28) is formed on a U-shaped extension of said connecting bracket (11), and additional sliding elements (29) are in sliding engagement thereon and seal snugly with an internal side of said connecting bracket (11).

18. An apparatus in accordance with claim 17, wherein said connecting bar (15) formed on said U-shaped bar is displaced toward the interior of said switch box, and a recess (20) is provided in one said side leg (17), said recess (20) corresponding to said front plate (30) whereby said front plate seals snugly with said U-shaped bar.

19. Apparatus for attachment of multiple structural support brackets to vertical frame components of a switch box, whereby support brackets provided with threaded connectors are connectable to said frame components and front plates of said support brackets are fastenable to said threaded connectors, comprising at least two connecting brackets (11) attachable to said frame components (10) of said switch box, said connecting brackets aligned opposite one another; a generally U-shaped bar comprising a middle piece (18) and two side legs (17, 19) connected to said connecting brackets by one said side leg; a contoured connecting bar (15) mounted on said generally U-shaped bar extending between said connecting brackets and directed parallel to said front side of said switch box; and at least one sliding element (21) provided with a threaded receptacle slidingly engaged on said connecting bar to which said support brackets provided with threaded connectors are attachable by an attachment screw.

20. An apparatus in accordance with claim 19, wherein an additional connecting bar (28) is formed on a U-shaped extension of said connecting bracket (11), and additional sliding elements (29) are in sliding engagement thereon and seal snugly with an internal side of said connecting bracket (11).

* * * * *